US008327199B1

(12) United States Patent  
Dastidar et al.

(10) Patent No.: US 8,327,199 B1  
(45) Date of Patent: Dec. 4, 2012

(54) INTEGRATED CIRCUIT WITH CONFIGURABLE TEST PINS

(75) Inventors: Jayabrata Ghosh Dastidar, Santa Clara, CA (US); Chiew Khiang Kuit, Penang (MY); Siew Ling Yeoh, Penang (MY); Jun Pin Tan, Kuala Lumpur (MY); Kok Sun Chia, Kuala Lumpur (MY); Yee Liang Tan, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 357 days.

(21) Appl. No.: 12/718,914

(22) Filed: Mar. 5, 2010

(51) Int. Cl.
*G01R 31/28* (2006.01)

(52) U.S. Cl. ......................................... 714/724; 714/727

(58) Field of Classification Search .................. 714/724, 714/726, 734
See application file for complete search history.

(56) References Cited

U.S. PATENT DOCUMENTS

| | | | | |
|---|---|---|---|---|
| 5,331,571 A * | 7/1994 | Aronoff et al. | ............... | 714/724 |
| 5,535,165 A * | 7/1996 | Davis et al. | ................... | 365/201 |
| 5,854,598 A * | 12/1998 | De Vries et al. | ............. | 341/120 |
| 6,018,815 A * | 1/2000 | Baeg | .............................. | 714/726 |
| 6,252,805 B1 * | 6/2001 | So et al. | .................... | 365/189.07 |
| 6,639,422 B1 * | 10/2003 | Albean | ........................... | 326/16 |
| 6,658,612 B1 * | 12/2003 | Park et al. | ..................... | 714/724 |
| 6,781,406 B2 * | 8/2004 | Emberling et al. | ............. | 326/38 |
| 7,219,270 B1 * | 5/2007 | Brown et al. | .................. | 714/700 |
| 7,274,203 B2 * | 9/2007 | Tumin et al. | ............. | 324/762.02 |
| 7,360,116 B2 * | 4/2008 | Nakamura | ....................... | 714/30 |
| 7,403,027 B2 * | 7/2008 | Lee et al. | ................. | 324/750.05 |
| 7,724,574 B2 * | 5/2010 | Kim et al. | ................ | 365/185.11 |
| 7,805,647 B2 * | 9/2010 | McGarry | ....................... | 714/724 |

* cited by examiner

*Primary Examiner* — James C Kerveros  
(74) *Attorney, Agent, or Firm* — Womble Carlyle Sandridge & Rice, LLP (57) ABSTRACT

Integrated circuits (ICs) with configurable test pins and a method of testing an IC are disclosed. An IC has input/output (I/O) pins that can be configured either as a test input pin, a test output pin or a user I/O pin. Selector circuits are used to selectively route and couple the I/O pins to various logic blocks and test circuitry on the IC. Selector circuits are also used to selectively couple either a user output or a test output to different I/O pins on the IC. Switches are used to configure the selector circuits and route test signals within the IC. Different configurations of the switches determine how the signals are routed. Test input signals from an I/O pin may be routed to any test circuitry within the IC and test output signals from a test circuit may be routed to any I/O pin on the IC.

20 Claims, 7 Drawing Sheets

INTEGRATED CIRCUIT WITH CONFIGURABLE TEST PINS

BACKGROUND

Integrated circuits (ICs), used in many programmable devices, include a variety of input/output (I/O) pins. Some of the I/O pins are used to perform different functions in a user design while others are used as pre-defined test pins. For applications that do not require a high number of I/O pins, some of the unused I/O pins must still exist in the design simply because they are predefined as test pins. These designated I/O test pins are used to test different parts of the IC.

For devices that share the same base layer, it may not be possible to use different packaging configurations simply because some of the I/O pins that are not used in the user application are still needed as test pins. Hence, the test pins generally need to be relocated for every different packaging configuration. This is a cumbersome process as some of the I/O pins may need to be rerouted in order to accommodate different applications and different packaging configurations.

Even though some smaller applications may not require a high number of I/Os, the same packaging configuration might still be needed in order to maintain a certain level of test coverage on the device. In other words, although some applications may require less I/O pins, the device might still have more I/O pins than needed because some I/O pins have already been predefined as test pins. When I/O pins are not assigned specifically to any logic blocks in the device, any existing I/O pins on the device can be used as test pins. This is more flexible than having predefined test pins because it eliminates the need to have specific I/O pins to be routed to specific logic blocks or test circuitry within the device.

Therefore, it is desirable to have configurable test pins that can easily be routed to different parts of the device. It is also desirable to have techniques to easily route the I/O pins so that the same I/O pin can be used as a user I/O pin, an input test pin or an output test pin when required. It is within this context that the invention arises.

SUMMARY

Embodiments of the present invention include circuits and a method for routing configurable test pins on an integrated circuit (IC).

It should be appreciated that the present invention can be implemented in numerous ways, such as a process an apparatus, a system, a device or a method on a computer readable medium. Several inventive embodiments of the present invention are described below.

In one embodiment, an integrated circuit (IC) is disclosed. The IC has input/output (I/O) pins that can be configured either as a test pin or a user I/O pin. A first selector circuit is coupled to a logic block within the IC such that the first selector circuit selectively couples an I/O pin to the logic block. For example, the logic block may be routed to a pre-determined I/O pin and the first selector circuit may couple either the pre-determined I/O pin or another I/O pin on the IC to the same logic block. The IC also includes a second selector circuit that selectively couples either a user output or a test output to an I/O pin. The output is routed through an output buffer on the IC which is controlled by a third selector circuit in the IC. Switches are used to control each of the output of the first, second and third selector circuits, respectively. The configuration of the switches determines the output of each of the switches.

In another embodiment, a method for testing an IC is provided. The method includes receiving a first signal and setting the IC into an appropriate operating mode based on the signal received. Switches in the IC are set based on the operating mode. The switches may be via switches that are configurable to connect to different logic elements on the IC. Test output signals are routed from a test circuit within the IC to an I/O pin configured as a test output pin and test input signals are routed from an I/O pin configured as a test input pin to a test circuit within the IC.

In another embodiment in accordance with the present invention, a process for preparing a test route in an IC is disclosed. The process includes receiving a test input signal at an I/O pin on the IC. Switches in the IC are set based on the test input signal received. The test input signal is routed to a logic block in the IC based on the setting of the switches. In one embodiment, the test input signal is routed through the core region of the IC to the specific logic block.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits with configurable test pins and a method for testing an integrated circuit (IC) with configurable test pins.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an integrated circuit (IC) with input/output (I/O) pins that can be configured and routed to different parts of the IC as test pins. Each I/O pin can be configured as either a test input pin, a test output pin, a user input pin or a user output pin. Switches are used in the IC to create configurable I/O paths that would allow user I/O pins to be used for test purposes when required. Switches discussed herein can refer to via switches, metal switches, one-time programmable switches, fuses or any other type of configurable devices capable of selecting the desired element for a particular mode of operation between two or more components, parts, or circuits. The embodiments allow signals received at I/O pins on the IC to be routed to different logic blocks or test circuitry within the IC. Therefore, there is no need to have certain I/O pins on the IC as predefined test pins. This increases the flexibility of the IC and the overall packaging configuration of the IC because the number of I/O pins required is based on the application that the IC is used for and is not constrained by the test coverage requirement. Having such a reassignment scheme can also potentially reduce the cost of a device without compromising the test coverage on that same device.

Figure 1:
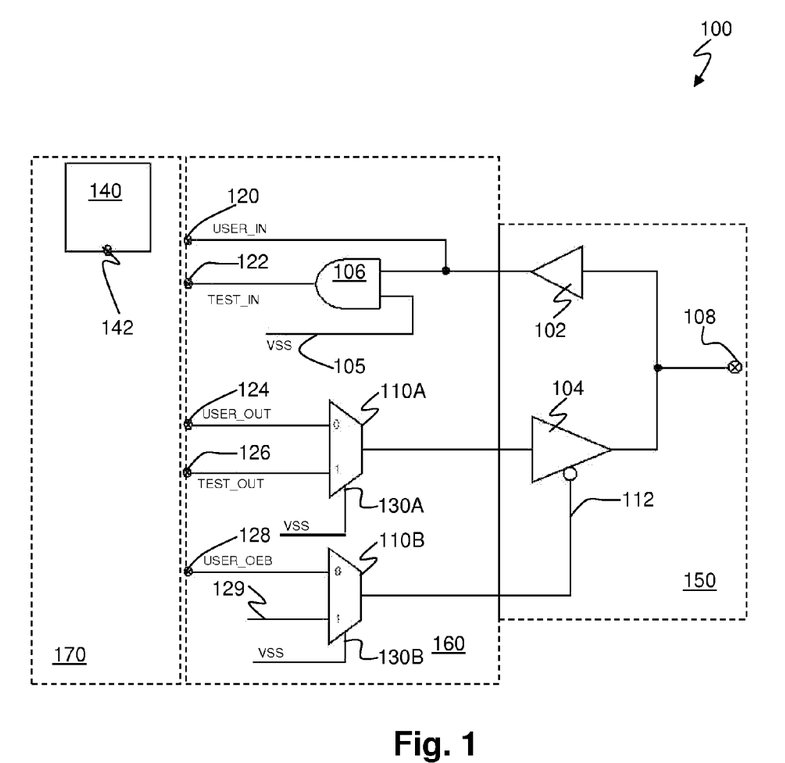
FIG. 1, meant to be illustrative and not limiting, shows an exemplary IC circuit with an I/O pin configured as a user I/O pin.

FIG. 1, meant to be illustrative and not limiting, shows exemplary IC circuit 100 with I/O pin 108 configured as a user I/O pin. Block 150 of IC circuit 100 shows a bi-directional I/O buffer while block 160 shows circuit elements in a selector circuit. Block 160 also represents a dual-function multiplexer (DFM). I/O pin 108 on IC circuit 100 is coupled to input buffer 102 and output buffer 104. In the illustrative embodiment of FIG. 1, I/O pin 108 is configured as a user I/O pin that can operate either as a user input pin or a user output pin. One skilled in the art should appreciate that pins described herein refer to connection points in the circuit. When operating as an input pin, I/O pin 108 receives input signals and transmits the input signals to pin 142 of logic block 140 through USER_IN pin 120. It should be appreciated that USER_IN pin 120, TEST_IN pin 122, USER_OUT pin 124 and TEST_OUT pin 126 may be coupled to logic block 140, details of which are explained in later paragraphs. Input buffer 102 is coupled to an input of AND gate 106. Another input of AND gate 106, input 105, is tied to a logic low level or VSS when I/O pin 108 is configured as a user I/O pin. The output of AND gate 106 is coupled to TEST_IN pin 122. TEST_IN pin 122 is coupled to a test circuitry within block 170 of circuit 100 when I/O pin 108 is configured as a test input pin, details of which are explained in later paragraphs. IC circuit 100 may be part of an IC circuit in a programmable logic device (PLD) and block 170 represents the core region of the PLD in one embodiment.

Referring still to FIG. 1, when operating as a user output pin, I/O pin 108 receives output signals from logic block 140 and transmits the signals to outside of IC circuit 100. When I/O pin 108 is configured to operate as a user output pin, pin 142 of logic block 140 is coupled to USER_OUT input 124 of selector circuit 110A. Selector circuits 110A and 110B controls output buffer 104 and enable 112 of output buffer 104, respectively. Select input 130 of selector circuits 110A and 110B is tied to a ground potential or VSS, or a logic low level. In one embodiment, USER_OEB 128 input of selector circuit 110B is tied to a logic low level to enable output buffer 104. Output signals from USER_OUT input 124 are transmitted through output buffer 104 to I/O pin 108. TEST_OUT input 126 and input 129 of selector circuits 110A and 110B, respectively, are not used when I/O pin 108 is configured as a user I/O pin. Both inputs 126 and 129 are used when I/O pin 108 is configured as an output test pin, details of which are explained below.

Figure 2A:
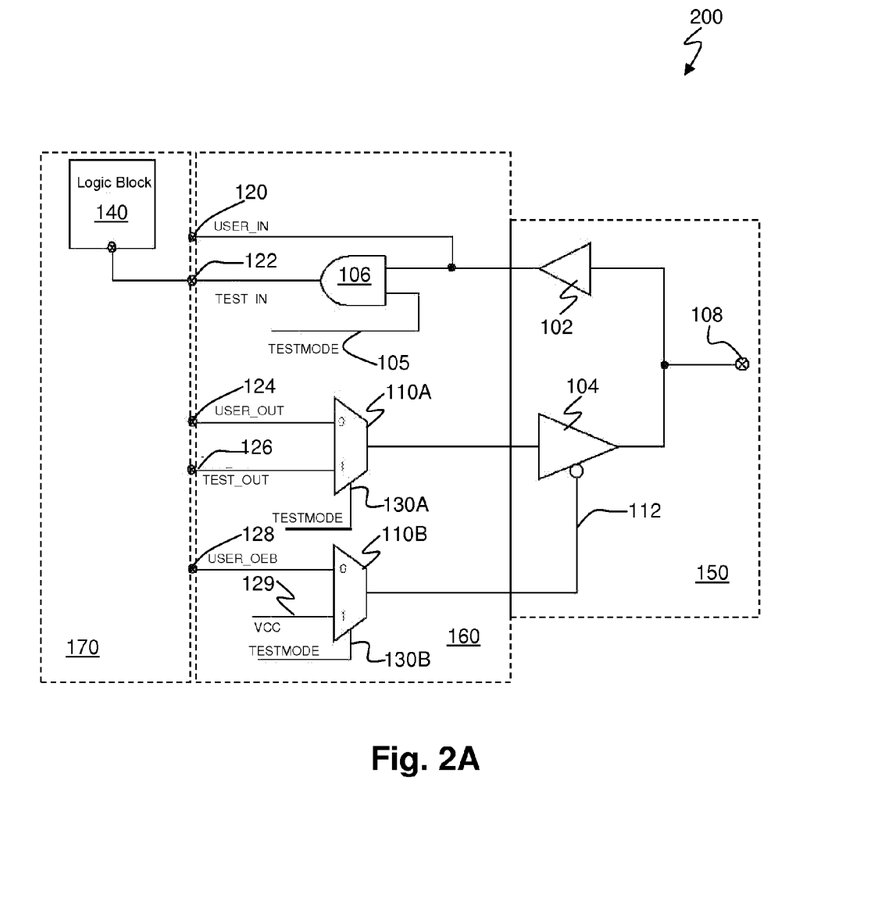
FIGS. 2A and 2B, meant to be illustrative and not limiting, each shows an exemplary IC circuit with an I/O pin configured as a test input pin and a test output pin, respectively.

FIG. 2A, meant to be illustrative and not limiting, shows exemplary IC circuit 200 with I/O pin 108 configured as a test input pin. For the sake of brevity, elements shown in FIG. 1 and described above, e.g., selector circuits 110A and 110B, input pins 124, 126, 128 and 129, select input 130, output buffer 104, and enable 112, are not repeated or described in detail here. When configured as a test input pin, I/O pin 108 receives and transmits test signals through input buffer 102 and AND gate 106 to logic block 140. Input pin 105 of AND gate 106 is coupled to TestMode signal. One skilled in the art should appreciate that the TestMode signal is a logic signal. In one embodiment, when I/O pin 108 is configured as a test input pin, TestMode is a logic high level signal or 1. Output TEST_IN 122 from AND gate 106 is coupled to logic block 140. In one embodiment, TEST_IN 122 is coupled to a test circuit within logic block 140. The logic high TestMode signal is also coupled to select input 130 of selector circuits 110A and 110B. Input 129 of selector circuit 130B is coupled to a voltage level, VCC, or a logic high level. The logic high level from input 129 is transmitted to enable 112 of output buffer 104. In the embodiment of FIG. 2A, enable 112 is an active low input, i.e., the input is activated when it receives a logic low level and deactivated when it receives a logic high level, and output buffer 104 is disabled when the logic high level from input 129 is coupled to enable 112.

Figure 2B:
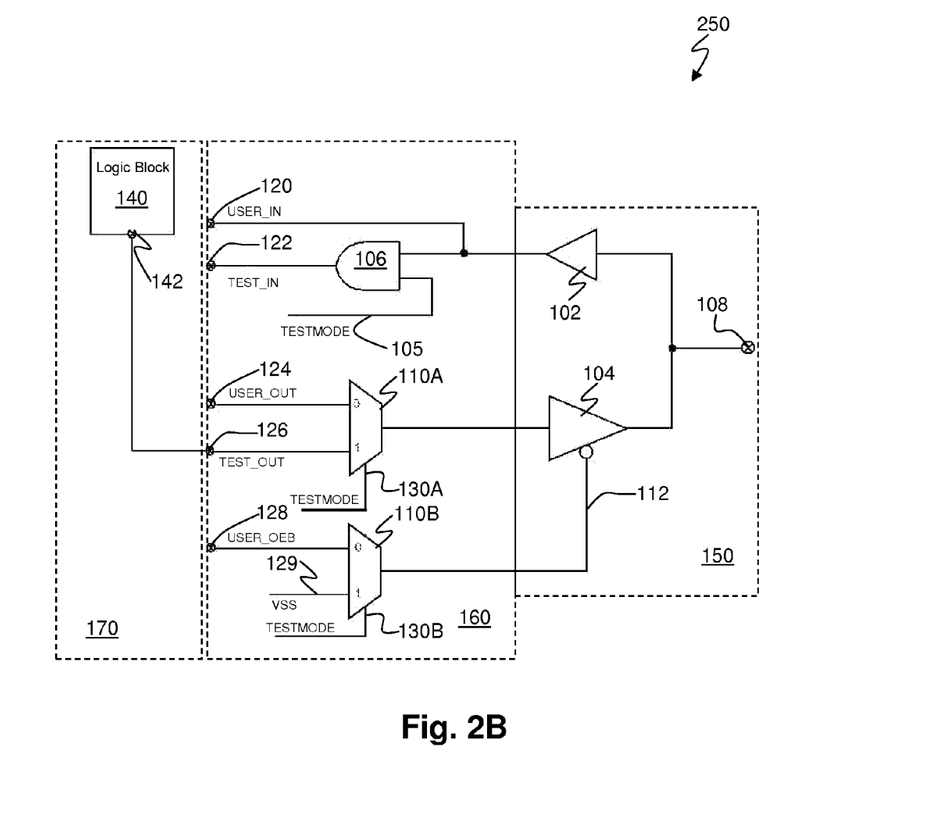

FIG. 2B, meant to be illustrative and not limiting, shows exemplary IC circuit 250 with I/O pin 108 configured as a test output pin. For the sake of brevity, elements shown in FIGS. 1 and 2A and described above, e.g., input buffer 102, AND gate 106, input 105, USER_IN pin 120 and TEST_IN pin 122, are not repeated or described in detail here. When configured as a test output pin, I/O pin 108 transmits test output signals from logic block 140 through output buffer 104 to other circuit elements that may be connected to IC circuit 250. Logic block 140 is coupled to TEST_OUT pin 126 of selector circuit 110A. In one embodiment, signals from a test circuit within logic block 140 are transmitted through pin 142 of logic block 140 to TEST_OUT pin 126. When I/O pin 108 is used as a test output pin, TestMode is set to a logic high level signal and coupled to select input 130 of selector circuits 110A and 110B. Input 129 of selector circuit 130B is coupled to a voltage low level, VSS. The voltage low level from input 129 is transmitted to enable 112 of output buffer 104. In the embodiment of FIG. 2B, output buffer 104 is enabled when enable 112 receives a logic low level signal. The test output signal from logic block 140 is transmitted through TEST_OUT pin 126 of selector circuit 110A and output buffer 104 to test output pin 108.

Even though I/O pin 108 of FIGS. 1, 2A and 2B can be configured as a user I/O pin, a test input pin and a test output pin, respectively, I/O pin 108 needs to be pre-defined either as a user I/O pin or a test I/O pin. In other words, if I/O pin 108 is configured or pre-defined as a test input pin, the same I/O pin cannot be used as a test output pin or a user I/O pin. I/O pin 108 in the embodiment of FIGS. 1, 2A and 2B also cannot be routed to other logic blocks once the I/O pin is associated with a specific logic block within the circuit. Embodiments of FIGS. 3A, 3B and 4 below shows circuits with I/O pins that are not pre-defined as test pins and can be routed to different logic blocks within the IC.

Figure 3A:
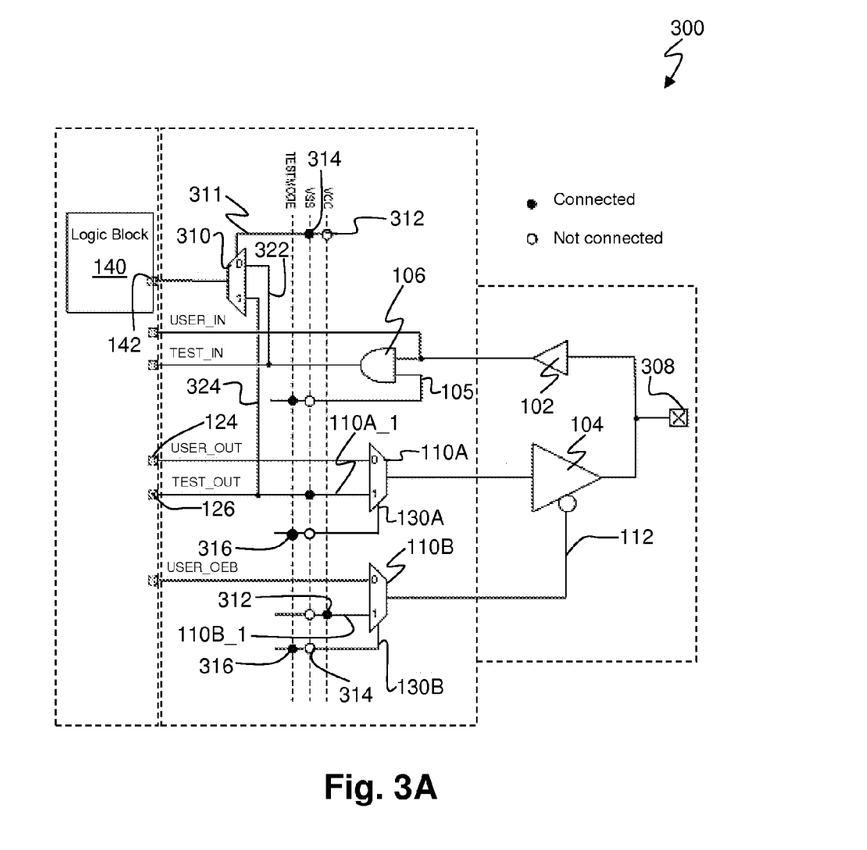
FIG. 3A, meant to be illustrative and not limiting, shows an IC circuit with a configurable I/O pin as one embodiment in accordance with the present invention.

FIG. 3A, meant to be illustrative and not limiting, shows IC circuit 300 with configurable I/O pin 308 as one embodiment in accordance with the present invention. I/O pin 308 can be configured either as a user I/O pin, a test input pin or a test output pin. Switches 312, 314 and 316, placed along dotted lines VCC, VSS and TESTMODE, respectively, are used to configure and route signals to and from I/O pin 308. In the embodiment of FIG. 3A, a white circle represents an open connection on a switch while a black circle represents a closed connection on a switch. Switches discussed herein can refer to via switches, fuses or any other type of configurable devices capable of selecting the desired element for a particular mode of operation between two or more components, parts, or circuits. The embodiment of FIG. 3A shows I/O pin 108 configured as a test input pin. Test input pin 308 receives test signals and transmits the signals through input buffer 102 and AND gate 106 to a test circuit within logic block 140. Input 105 of AND gate 106 is coupled to switch 316. In the embodiment of FIG. 3A, switch 316 is coupled to a logic signal, TESTMODE. TESTMODE signal as shown in the embodiment of FIG. 3A is a logic high level signal. In an exemplary embodiment, TESTMODE switch 316 may be coupled to a configuration random-access-memory (CRAM) bit on the IC and is set to a logic high level when the CRAM bit is set. In one such embodiment, the CRAM bit on the IC may be coupled to a pre-determined I/O pin that can be used to control the CRAM bit. The logic high level of TESTMODE signal allows AND gate 106 to transmit signals from input buffer 102 as an output. Selector circuit 310 selectively couples either the test input signals from I/O pin 308 or test signals received at TEST_OUT pin 126. Selector circuits described herein may be multiplexers. For example, selector circuit 310 is a 2-to-1 multiplexer, in one embodiment. Test signals received at TEST_OUT pin 126 may be from a different IC circuit or another logic block, details of which are shown and explained in subsequent paragraphs. When I/O pin 308 is configured as a test input pin, select input 311 of selector circuit 310 is coupled to switch 314. In the embodiment of FIG. 3A, switch 314 is tied to a ground potential, VSS, or a logic low level, 0. Selector circuit 310 transmits the signals received at input 322, i.e., test input signals from AND gate 106, to input pin 142 of logic block 140 based on the signal received at select input 311.

Referring still to FIG. 3A, the second input of selector circuit 310, input 324, is coupled to TEST_OUT pin 126. When I/O pin 308 is configured as a test input pin, output buffer 104 is disabled. Select inputs 130A and 130B of selector circuits 110A and 110B, respectively, are coupled to switch 316 that supplies a logic signal, i.e., TESTMODE. In the embodiment of FIG. 3A, TESTMODE is a logic high level signal. Therefore, selector circuits 110A and 110B will couple signals received at the second input terminals, 110A_1 and 110B_1, respectively, to output buffer 104 and enable 112. Input 110A_1 is coupled to switch 314 which is tied to a ground potential. Therefore, in this embodiment, selector circuit 110A outputs a ground potential. To disable output buffer 104, enable 112 of input buffer 104 needs to be coupled to a logic high level or a positive voltage level. In the embodiment of FIG. 3A, input 110B_1 is coupled to switch 312, which is tied to a voltage level, VCC. The output of selector circuit 110B, a positive voltage level, is coupled to enable 112 and is used to disable output buffer 104. Even though the embodiment of FIG. 3A shows I/O pin 308 configured as a test input pin, one skilled in the art should appreciate that I/O pin 308 can be configured as a user input pin or a test output pin, similar to the embodiments of FIG. 1 and FIG. 2B, respectively, based on the configuration of switches 312, 314 and 316.

Figure 3B:
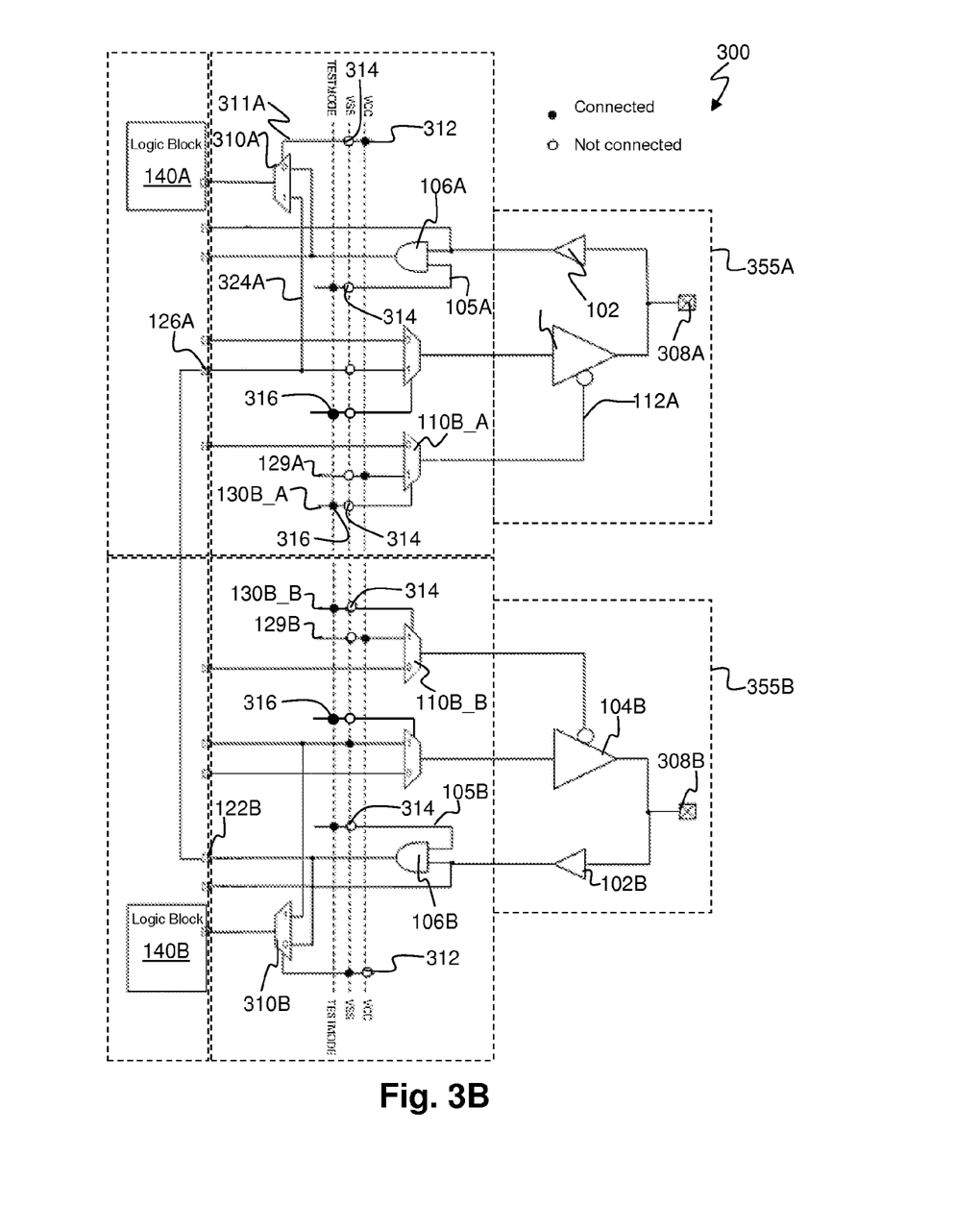
FIG. 3B, meant to be illustrative and not limiting, shows an I/O pin from an I/O circuit configured as a test input pin and routed to another I/O circuit as one embodiment in accordance with the present invention.

FIG. 3B, meant to be illustrative and not limiting, shows I/O pin 308B of I/O circuit 355B configured as a test input pin and routed to I/O circuit 355A as one embodiment in accordance with the present invention. For the sake of brevity, elements shown in FIG. 3A and described above, e.g., input buffer 102, AND gate 106, input 105, USER_IN pin 120 and TEST_IN pin 122, are not repeated or described in detail here. In one embodiment, I/O circuits 355A and 355B are I/O circuits on an IC chip and I/O pins 308A and 308B are I/O pins on the IC chip that are used as connection points that transmit and receive signals to and from other circuits that may be connected to the IC. In the embodiment of FIG. 3B, I/O pin 308A is an unused I/O pin, i.e., I/O pin 308A is not used as a user I/O pin in a user program, while I/O pin 308B is a user I/O pin that is used in the user program. In this instance, when I/O circuits 355A and 355B are circuits on a packaged IC chip, the unused I/O pin 308A can be concealed within the IC package. In other words, the unused I/O pin will not be bonded out on the IC package. When I/O pin 308B is used as a user I/O pin in a user design, input signals received at I/O pin 308B is transmitted to logic block 140B through input buffer 102B, AND gate 106B and selector circuit 310B. However, in the embodiment of FIG. 3B, select circuit 310B is not electronically connected to logic block 140B because I/O pin 308B is not configured as a user input pin in this instance.

Referring still to the embodiment of FIG. 3B, I/O pin 308B is used as a test input pin to test logic block 140A. In order to route test signals received at I/O pin 308B to the test circuit within logic block 140A, switches 312, 314 and 316 need to be configured accordingly. In the embodiment of FIG. 3B, test input signals are received at I/O pin 308B and transmitted to TEST_IN pin 122B through input buffer 102B and AND gate 106B. When I/O pin 308B is configured as a test input pin, input 105B of AND gate 106B is coupled to TESTMODE switch 316. Test signals are routed through TEST_IN pin 122B to TEST_OUT pin 126A of I/O circuit 355A. In an exemplary embodiment, the test signals are routed on a configurable metal layer of the IC device. TEST_OUT pin 126A receives the test signals and routes the test signals to logic block 140A through selector circuit 310A. Select input 311A of selector circuit 310A is coupled to switch 312. In the embodiment of FIG. 3B, switch 312 is tied to a logic high level or a positive voltage level, i.e., VCC. Selector circuit 310A selectively transmits the signals received at input 324A based on the signal received at select input 311A.

Referring still to FIG. 3B, I/O pin 308A in this embodiment is an unused I/O pin. Input 105A of AND gate 106A is coupled to TESTMODE switch 316. One skilled in the art should appreciate that input 105A is connected to TESTMODE switch 316 to indicate that I/O pin 308A in the embodiment of FIG. 3B is a test input pin. However, since I/O pin 308A in this embodiment is an unused test input pin, test signals will not be transmitted to I/O pin 308A. Output buffer 104A is disabled by connecting select input 130A and input 129A of select circuit 110B_A to TESTMODE switch 316 and VCC switch 312, respectively. Because I/O pin 308B is not used as a test output pin, output buffer 104B in I/O circuit 355B is also disabled in the embodiment of FIG. 3B. Select input 130B and input 129B are connected to TESTMODE switch 316 and VCC switch 312, respectively. The logic high signal from select circuit 110B_B disables output buffer 104B. Even though a specific configuration is shown in the embodiment of FIG. 3B, one skilled in the art should appreciate that, based on the configurations of the switches, different combinations can be formed to relocate any test input pin or test output pin to any of the I/O pins on the device. One skilled in the art should also appreciate that even though specific logic elements are shown in the embodiments of FIGS. 3A and 3B, other logic elements that are capable of performing the same functions may be used in this context.

Figure 4:
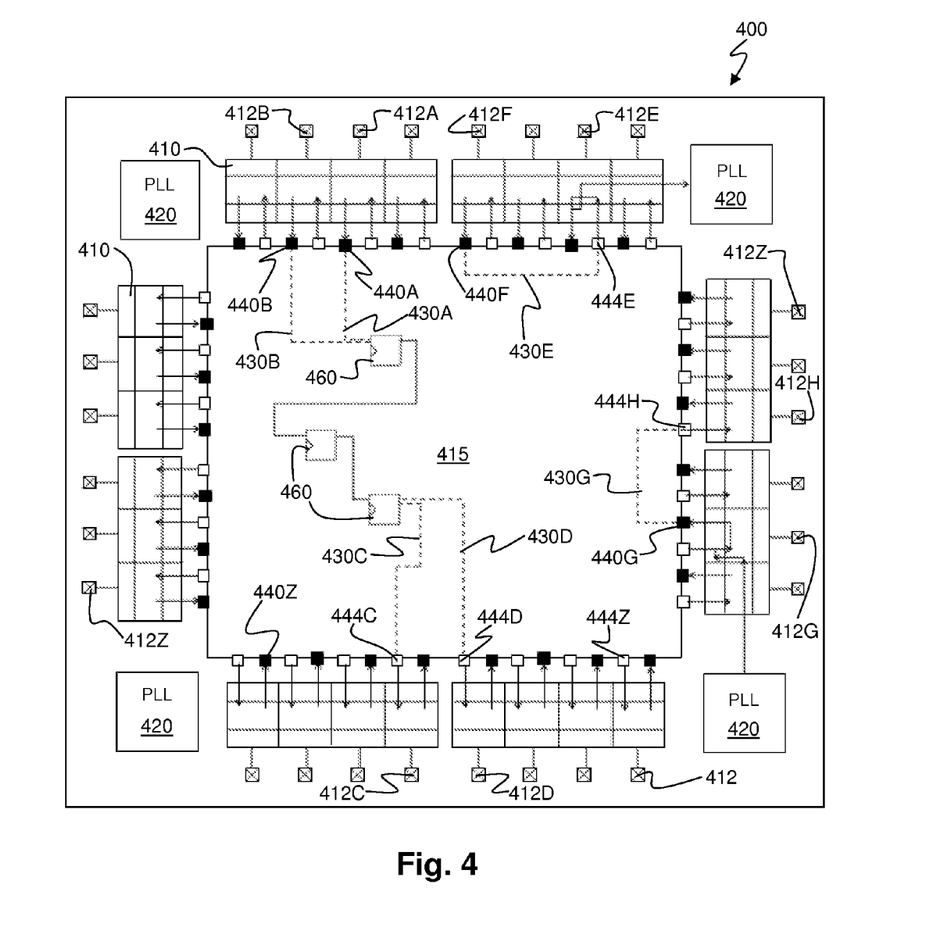
FIG. 4, meant to be illustrative and not limiting, shows an embodiment of a programmable device in accordance with the present invention.

FIG. 4, meant to be illustrative and not limiting, shows an embodiment of a programmable device 400 in accordance with the present invention. Programmable device 400 includes core logic region 415 and I/O blocks 410. Other auxiliary circuits such as phase-locked loops (PLLs) 420 for clock generation and timing, can be placed in between I/O elements 410 and other unoccupied areas in logic region 415. Logic region 415 may be filled with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. I/O elements 410 are preferably located around core region 415 and the perimeter of programmable device 400. In some embodiments, I/O elements 410 may support multiple I/O standards that may include single-ended as well as differential I/O standards.

Referring still to FIG. 4, I/O elements 410 may include buffer blocks and selector blocks similar to I/O buffer block 150 and DFM block 160 of FIG. 1, respectively. I/O elements 110 also include I/O pins 412Z that are located around programmable device 400. I/O pins 412Z may be user I/O pads that can be used to connect programmable device 400 to other circuitry. In one embodiment, each I/O pin 412Z is connected to an I/O buffer block and a DFM block as shown in circuit 300 of FIG. 3A. In the embodiment of FIG. 4, there are several input 440Z and output 444Z ports located around the perimeter of core logic region 415. Input and output ports, 440Z and 444Z, respectively, are connection points that connect I/O elements 410 to core logic region 415. The embodiment of FIG. 4 shows I/O pin 412A routed to another pin, i.e., I/O pin 412B. In one embodiment, I/O pin 412A is a test input pin that routes test signals received at I/O pin 412A through input port 440A to logic elements 460 located in logic core region 415. The route is represented by dotted line 430A in the embodiment of FIG. 4. In another embodiment, I/O pin 412A is an unused I/O pin in a user application while I/O pin 412B is a user I/O pin in the same user application. When test input pin 412A is assigned or routed to I/O pin 412B, the test signals are routed from test input pin 412B through input port 440B to logic elements 460 in logic core region 415. The route is represented by dotted line 430B in the embodiment of FIG. 4. The embodiment of FIG. 3B shows how test input signals may be routed from one I/O pin to another.

The embodiment of FIG. 4 also shows output pin 412C reassigned to I/O pin 412D. Dotted line 430C represents the route of the signals from logic elements 460 to I/O pin 412C through output port 444C. When output pin 412C is reassigned to pin 412D, signals from logic elements 460 within core logic region 415 are routed to I/O pin 412D through output port 444D. The route is represented by dotted line 430D in the embodiment of FIG. 4. In one embodiment, the I/O pin 412D is a test output pin and the signals routed from the core logic region are test output signals. Test input signals can also be routed from an I/O pin to one of the auxiliary circuit blocks 420. In the embodiment of FIG. 4, I/O pin 412E is reassigned to I/O pin 412F and input signals travel from input port 440F to output port 444E through route 430E. The signals can be routed to auxiliary circuit block 420 located at the top right corner of device 400 in the embodiment of FIG. 4. Test output signals can also be routed from an auxiliary circuit block to an I/O pin. In the embodiment of FIG. 4, output test pin 412G is reassigned to I/O pin 412H. Test output signals are routed from an auxiliary circuit block 420, located at the bottom right corner of programmable device 400, to input port 440G. The test output signals are routed from input port 440G through route 430G to I/O pin 412H through output port 444H. One skilled in the art should appreciate that any of the I/O pins 412Z can be used as a user I/O pin or a test I/O pin based on the configurations of the switches shown in the embodiments of FIGS. 3A and 3B.

Figure 5:
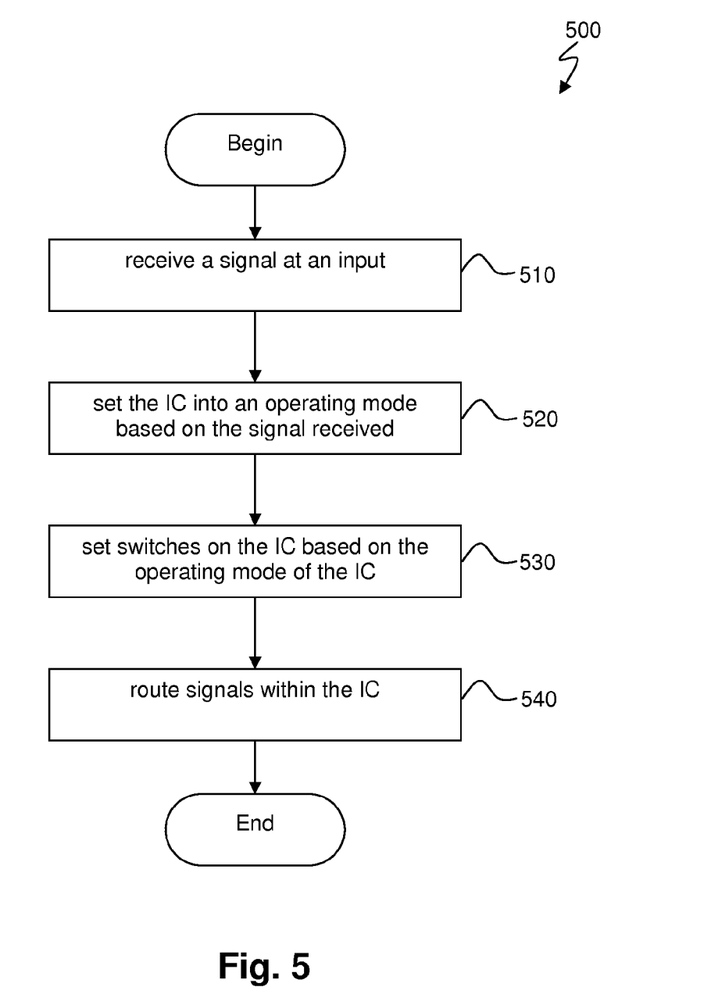
FIG. 5, meant to be illustrative and not limiting, is a simplified flow chart showing a method flow for testing an IC.

FIG. 5, meant to be illustrative and not limiting, shows method flow 500 for testing an IC. In one embodiment, the IC may be similar to programmable device 400 shown in FIG. 4. A signal is received in operation 510. In one embodiment, the signal may be a configuration random-access-memory (CRAM) bit setting within the IC that is tied to a pre-designated I/O pin. The IC is set into a specific operating mode based on the signal received in operation 520. In an exemplary embodiment, the operating mode of the IC is set to test mode. A set of switches in the IC is set based on the operating mode in operation 530. In the embodiment of FIGS. 3A and 3B, the switches are via switches, i.e., VCC switch 312, VSS switch 314 and TESTMODE switch 316. Test signals are routed either from a test circuit to an I/O pin or from an I/O pin to a test circuit within the IC in operation 540. In the embodiment of 3B, test input signals are routed from I/O pin 308B to test circuit within logic block 140A.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC), comprising:
   an input/output (I/O) pin, wherein the I/O pin is configured as one of a test pin and a user I/O pin;
   a first selector circuit having an output coupled to a logic block, wherein the first selector circuit selectively couples one of the I/O pin or another I/O pin to the logic block;

a second selector circuit having an output coupled to an output buffer, wherein the second selector circuit is configured to select one of a user output or a test output as an output of the I/O pin;

a third selector circuit having an output coupled to the output buffer, wherein the third selector circuit selectively enables and disables the output buffer; and a plurality of switches, wherein each of the plurality of switches is configurable to couple to the first, second and third selector circuits, and wherein a configuration of the switches determines each of the outputs of the first, second and third selector circuits.

2. The IC of claim 1, wherein the plurality of switches are via switches.

3. The IC of claim 1, wherein the I/O pin is configured as a test output pin.

4. The IC of claim 1, wherein the I/O pin is configured as a test input pin.

5. The IC of claim 1, wherein the plurality of switches comprises a first switch coupled to a first logic signal, a second switch coupled to a second logic signal and a third switch coupled to a third logic signal.

6. The IC of claim 5, wherein the first logic signal is a logic high level, the second logic signal is a ground potential and the third logic signal is a test-mode signal.

7. The IC of claim 6, wherein the IC is under test-mode when the test-mode signal is at a logic high level.

8. A programmable logic device (PLD) comprising the IC of claim 1, wherein the I/O pin is a user I/O pin on the PLD.

9. A method of testing an integrated circuit (IC), comprising:
receiving a first signal;
setting the IC into an operating mode based on the first signal received;
setting a plurality of switches based on the operating mode, wherein each switch of the plurality of switches is configured to be coupled to any of a logic signal, a ground potential, and a voltage level; and
routing a test output signal from a test circuit to an I/O pin when the I/O pin is configured as a test output pin and routing a test input signal from the I/O pin to the test circuit when the I/O pin is configured as a test input pin.

10. The method of claim 9, wherein the first signal is received from a CRAM bit setting.

11. The method of claim 9, wherein the first signal is received from a pre-designated I/O pin on the IC.

12. The method of claim 9, wherein the first signal is an active high signal at a logic high level and the operating mode is a test mode.

13. The method of claim 9, wherein the routing is performed by a selector circuit, wherein the selector circuit selectively couples the test input signal from the test input pin to the test circuit based on the setting of the plurality of switches.

14. The method of claim 9, further comprising:
receiving a test input signal at the I/O pin; and
routing the test input signal through a core of the IC to the test circuit, wherein the test input signal is routed based on the setting of the plurality of switches.

15. The method of claim 14, further comprising:
routing the test output signal from the test circuit to another I/O pin on the IC.

16. The method of claim 9, further comprising disabling an unused I/O pin in the IC.

17. A test route in an integrated circuit (IC) prepared by a process, the process comprising:
receiving a test input signal at an I/O pin;
setting a plurality of switches based on the test input signal received;
routing the test input signal to a logic block in the IC based on the setting of the plurality of switches, wherein the test input signal is routed through a core of the IC to the logic block; and
resetting the plurality of switches to send a test output signal to the I/O pin.

18. The test route of claim 17, further comprising:
setting the plurality of switches to configure another I/O pin as an output test pin; and
routing a test output signal from a test circuit in the IC to the output test pin.

19. The test route of claim 17, wherein the routing is done on a customizable layer on the IC.

20. The test route of claim 17, wherein the I/O pin is a user I/O pin and the test input signal is routed to a test circuit within the logic block.

* * * * *